US010587023B2

(12) United States Patent
Zihir et al.

(10) Patent No.: US 10,587,023 B2
(45) Date of Patent: Mar. 10, 2020

(54) 90 DEGREE DIFFERENTIAL SIGNAL LAYOUT TRANSITION

(71) Applicant: Integrated Device Technology, Inc., San Jose, CA (US)

(72) Inventors: Samet Zihir, San Diego, CA (US); Tumay Kanar, San Diego, CA (US); Naveen Krishna Yanduru, San Diego, CA (US)

(73) Assignee: Renesas Electronics America Inc., San Jose, CA (US)

( * ) Notice: Subject to any disclaimer, the term of this patent is extended or adjusted under 35 U.S.C. 154(b) by 91 days.

(21) Appl. No.: 15/880,957

(22) Filed: Jan. 26, 2018

(65) Prior Publication Data

US 2019/0123410 A1    Apr. 25, 2019

Related U.S. Application Data

(60) Provisional application No. 62/575,346, filed on Oct. 20, 2017.

(51) Int. Cl.
| | |
|---|---|
| H03H 7/38 | (2006.01) |
| H01P 1/02 | (2006.01) |
| H05K 1/02 | (2006.01) |
| H01P 3/08 | (2006.01) |
| H01P 3/02 | (2006.01) |
| H01Q 1/24 | (2006.01) |
| H05K 1/11 | (2006.01) |
| H01Q 21/06 | (2006.01) |

(52) U.S. Cl.
CPC ............... *H01P 1/02* (2013.01); *H01P 3/026* (2013.01); *H01P 3/08* (2013.01); *H03H 7/38* (2013.01); *H05K 1/0245* (2013.01); *H01Q 1/243* (2013.01); *H01Q 21/061* (2013.01); *H05K 1/115* (2013.01); *H05K 2201/09227* (2013.01); *H05K 2201/09236* (2013.01); *H05K 2201/09272* (2013.01); *H05K 2201/09681* (2013.01)

(58) Field of Classification Search
CPC ... H03H 7/38; H01P 1/02; H01P 3/026; H01P 3/08; H05K 1/0245; H05K 2201/09227; H05K 2201/09245; H05K 2201/09236; H05K 2201/09681
USPC .............................................. 333/1, 4, 5, 33
See application file for complete search history.

(56) References Cited

U.S. PATENT DOCUMENTS

| 8,633,399 B2 * | 1/2014 | Kagaya | ..................... H01P 1/02 174/250 |
|---|---|---|---|
| 2011/0279189 A1 * | 11/2011 | Umeda | ................ H05K 1/0245 333/5 |

* cited by examiner

*Primary Examiner* — Stephen E. Jones
(74) *Attorney, Agent, or Firm* — Christopher P. Maiorana, PC

(57) ABSTRACT

An apparatus includes a plurality of conductive layers and a plurality of traces configured to carry a plurality of signals through a change of direction. The traces may be routed parallel to each other in a first trace segment in a first of the conductive layers toward the change of direction. The traces may be routed parallel to each other in a second trace segment in a second of the conductive layers in the change of direction. One of the traces in a third trace segment in the first conductive layer may cross over another of the traces in the second trace segment in the second conductive layer in the change of direction. The traces may be routed parallel to each other in the third trace segment in the first conductive layer away from the change of direction.

20 Claims, 8 Drawing Sheets

US 10,587,023 B2

90 DEGREE DIFFERENTIAL SIGNAL LAYOUT TRANSITION

This application relates to U.S. Provisional Application No. 62/575,346, filed Oct. 20, 2017, which is hereby incorporated by reference in its entirety.

FIELD OF THE INVENTION

The invention relates to microwave and millimeter-wave circuit design generally and, more particularly, to a method and/or apparatus for implementing a 90 degree differential signal layout transition.

BACKGROUND

Conventional parallel traces that route high-frequency differential signals cause issues where a length of one trace is longer than the other trace. The different lengths are commonly caused by 90 degree bends where a radius of curvature of an inner trace is shorter than a radius of curvature of an outer trace. The different lengths create imbalanced phases in the two signal components that make up the differential signal. A pulse traversing the shorter trace will arrive at a destination before a complementary pulse that traverses the longer trace. The two pulses also experience different impedances from a source to the destination. The different impedances cause the two pulses to have different amplitudes upon reaching the destination.

It would be desirable to implement a 90 degree differential signal layout transition.

SUMMARY

The invention concerns an apparatus including a plurality of conductive layers and a plurality of traces configured to carry a plurality of signals through a change of direction. The traces may be routed parallel to each other in a first trace segment in a first of the conductive layers toward the change of direction. The traces may be routed parallel to each other in a second trace segment in a second of the conductive layers in the change of direction. One of the traces in a third trace segment in the first conductive layer may cross over another of the traces in the second trace segment in the second conductive layer in the change of direction. The traces may be routed parallel to each other in the third trace segment in the first conductive layer away from the change of direction.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method to implement a 90 degree differential signal layout transition that may (i) improve phase imbalances, (ii) lower amplitude imbalances, (iii) occupy a small area and/or (iv) be implemented on one or more integrated circuits.

Figure 1:
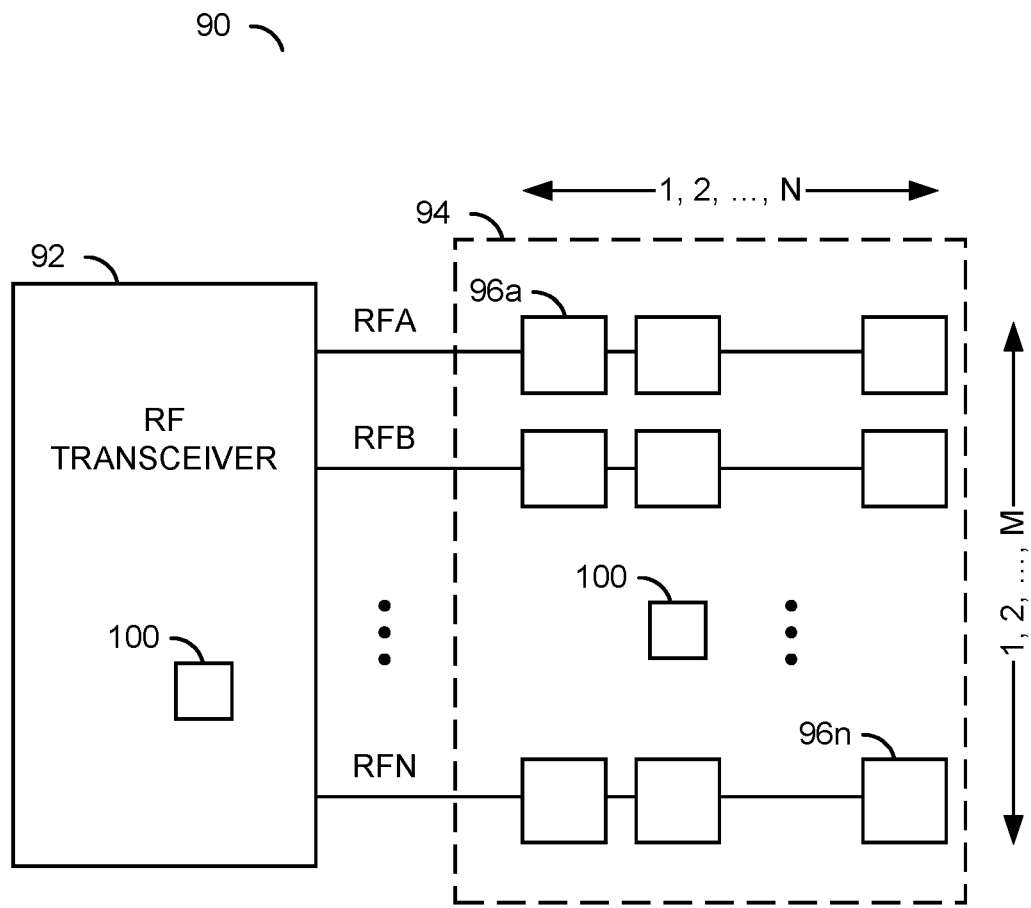
FIG. 1 is a block diagram of a system illustrating a context of the invention.

Referring to FIG. 1, a block diagram of a system 90 illustrating a context of the invention is shown. The system (or module or circuit or apparatus) 90 may implement a phased array system in accordance with an example embodiment of the invention. The phased array system 90 generally comprises a block (or circuit) 92 and a block (or circuit) 94. The circuit 94 may comprise multiple blocks (or circuits) 96a-96n. Each of the circuit 92 and the circuit 94 may include one or more blocks (or circuits) 100. The circuits 92-100 may be implemented with hardware, a combination of hardware and software and/or simulated with software.

Multiple signals (e.g., RFA to RFN) may be exchanged between the circuit 92 and the circuits 96a-96n. Each signal RFA to RFN may implement a radio frequency signal. In a transmit mode, the radio frequency signals RFA to RFN may be high power signals used to broadcast information from the circuit 94. In a receive mode, the radio frequency signals RFA to RFN may be low power signals received by the circuit 94. In various embodiments, the radio frequency signals RFA to RFN may be in a range of frequencies centered around approximately 28 gigahertz (GHz) or approximately 39 GHz (e.g., 24 GHz to 30 GHz or 37 GHz to 44 GHz). Other frequency ranges may be implemented to meet the design criteria of a particular application.

The phased array system 90 may generate one or more radio-frequency (RF) beams at a time. The phased array system 90 may be configured to operate at common wireless radio frequencies, millimeter-wave frequencies, and/or microwave frequencies. In various embodiments, the long range communications link may be part of a fifth generation (5G) wireless communications system (e.g., for which a standard is currently under development by the Next Generation Mobile Networks (NGMN) Alliance). In other embodiments, the long range communications link may be part of a fourth generation (4G) wireless communications system (e.g., International Mobile Telecommunications-Advanced (IMT-A) standard published by the International Telecommunications Unit Radiocommunication Sector (ITU-R)). However, other communications standards may be implemented to meet the design criteria of a particular application.

The circuit 92 may implement an RF transceiver circuit 92. In an example, the RF transceiver 102 may comprise a number of fed channels, and may store gain values (or parameters), amplitude values (or parameters) and phase values (or parameters). The gain/amplitude/phase values are generally used in beamforming. The gain/amplitude/phase values may be pre-loaded into a lookup table to enable very fast beam steering (e.g., approximately 30 nanoseconds) when implemented as part of a beamsteering network. The gain/amplitude/phase values may be copied into the fed channels of the RF transceiver 92 to determine RF beam patterns created by the circuit 94.

The circuit 94 may implement an N×M element antenna array circuit 94. The circuits 96a-96n may implement fed antenna arrays. Each fed antenna array 96a-96n may include multiple antenna elements. In some embodiments, a number of fed antenna arrays 96a-96n may be similar to the number of feed channels in the RF transceiver 92. In various embodiments, multiple fed antenna arrays 96a-96n may be coupled to a single feed channel. The fed channels of the RF transceiver 92 may be coupled by corresponding bidirectional signals to the fed antenna arrays 96a-96n to implement an M-way antenna array module. Any or all of the fed antenna arrays 96a-96n of the antenna array 94 may be switchable between a transmit mode and a receive mode in conjunction with any or all of the fed channels of the RF transceiver 92 to send and receive the signals.

Each transition circuit 100 may implement a 90 degree (or right corner) multiple-signal transition layout. The transition circuits 100 may be designed to permit the high-frequency differential signals used in the RF transceiver 92 and the antenna array 94 to spatially round corners (or curves) with minimal phase imbalances and/or low amplitude imbalances. Although a single transition circuit 100 is shown in each of the RF transceiver 92 and the antenna array 94, multiple transitions circuits 100 may be implemented in each to meet the design criteria of a particular application.

Figure 2:
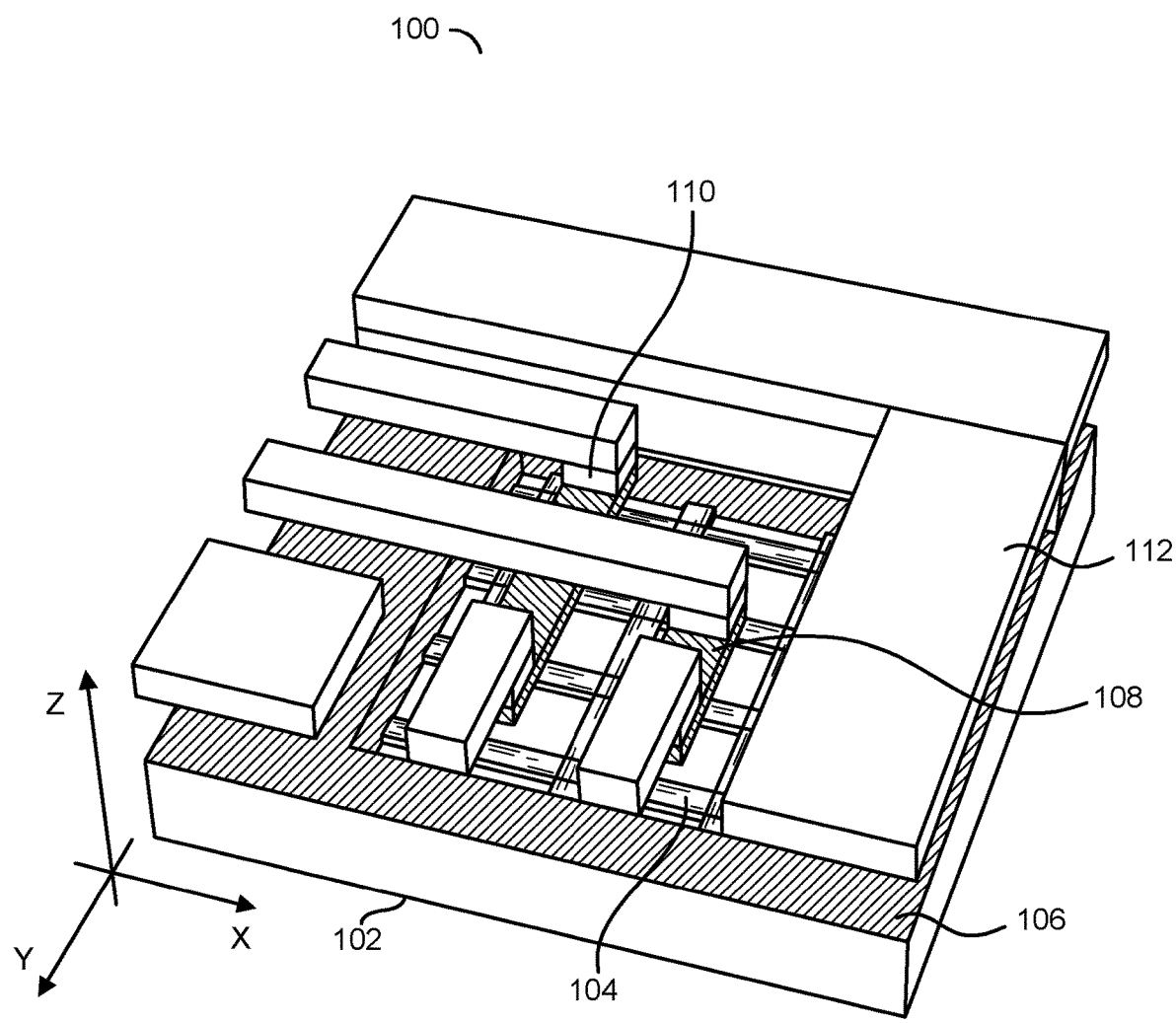
FIG. 2 is a perspective diagram of a corner portion of a transition circuit in the system of FIG. 1 in accordance with an embodiment of the invention.

Referring to FIG. 2, a perspective diagram of an example corner portion of a transition circuit 100 is shown in accordance with an embodiment of the invention. The transition circuit 100 generally comprises a substrate (or base) 102, a layer (or region) 104, a layer (or region) 106, a layer (or region) 108, a layer (or region) 110 and a layer (or region) 112. The figure generally illustrates a right corner (or change in direction) in a differential trace spatially changing between an X axis and a Y axis. Corners in other directions, corners of other than 90 degrees and/or corners having more than two traces may be implemented to meet the design criteria of a particular application.

The layer 102 generally implements a substrate. The layer 102 may be formed with a semiconductor (e.g., silicon or Gallium Arsenide). In some embodiments, the layer 102 may be a semi-insulating substrate or an insulating substrate. For example, the insulating substrate may be a printed circuit board. Other substrate materials may be implemented to meet the criteria of a particular application.

The layer 104 generally implements a conductive layer formed above the substrate 102. The conductive layer 104 may be a bottom metal layer (e.g., an M1 metal layer) formed on the substrate 102. Where the substrate 102 is conductive and/or semi-conductive, an optional insulating layer may be formed between the conductive layer 104 and the substrate 102. In various embodiments, the conductive layer 104 may be utilized as a ground plane.

The layer 106 generally implements another conductive layer formed above the conductive layer 104. The conductive layer 106 may be a lower intermediate metal layer (e.g., an M2 metal layer). An insulating layer formed between the bottom conductive layer 104 and the lower intermediate conductive layer 106 may electrically isolate the bottom conductive layer 104 from the lower intermediate conductive layer 106. In various embodiments, the lower intermediate conductive layer 106 may be utilized as a signal carrying plane and as another ground plane.

The layer 108 generally implements a conductive layer formed above the lower intermediate conductive layer 106. The conductive layer 108 may be an upper intermediate metal layer (e.g., an M3 metal layer). The upper intermediate conductive layer 108 may be electrically isolated from the lower intermediate conductive layer 106 by an insulating layer. In various embodiments, the upper intermediate conductive layer 108 may be utilized as a signal carrying plane.

The layer 110 generally implements a via layer. The via layer 110 may be formed with an insulating material, such as silicon dioxide. The via layer 110 may be configure to provide openings between the upper intermediate conductive layer 108 and the layer 112 for inter-conductive layer connections.

The layer 112 generally implements a conductive layer formed above the upper intermediate conductive layer 108. The conductive layer 112 may be a top metal layer (e.g., an M4 metal layer). The insulating via layer 110 may electrically isolate the upper intermediate conductive layer 108 from the top conductive layer 112. The top conductive layer 112 may be utilized as a signal carrying plane.

While the invention has been disclosed in terms of four conductive layers 104, 106, 108 and 112, other numbers of layers may be implemented to meet the design criteria of a particular application. For example, a foundry used to fabricate the transition circuit 100 may provide greater than four (e.g., eleven) conductive (or metal) layers for the design. Although any of the multiple conductive layers may be used, the conductive layers 106, 108 and 112 are generally fabricated in the top three conductive layers (e.g., M9, M10 and M11).

Figure 3:
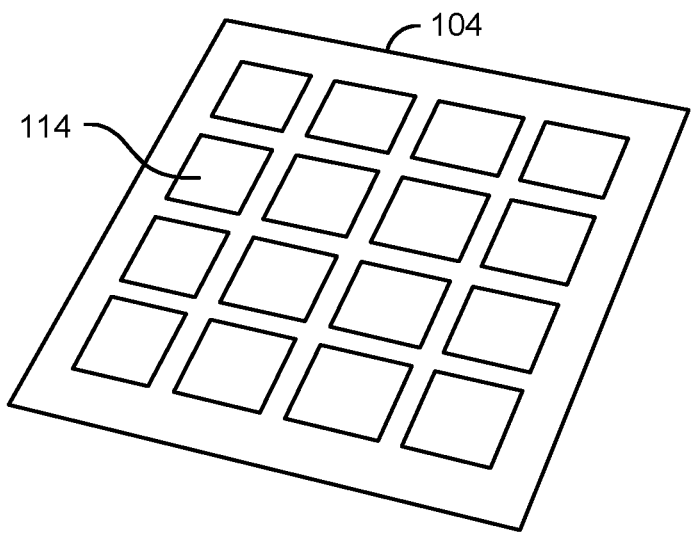
FIG. 3 is a layout diagram of a bottom metal layer of the transition circuit in accordance with an embodiment of the invention.

Referring to FIG. 3, a layout diagram of an example implementation of the bottom metal layer 104 is shown in accordance with an embodiment of the invention. The bottom metal layer 104 may be patterned to form a mesh 114 in an area where the corner (or change of direction) exists. The mesh 114 may provide a ground plane for the traces in the area of the change of direction. A distance between the grounded mesh 114 and signal traces in the upper intermediate conductive layer 108 may approximately match a distance between the grounded lower intermediate conductive layer 106 and signal traces in the top conductive layer 112 to maintain consistent transmission line characteristics (e.g., impedance) of the signal traces through the change of direction.

In various embodiments, conductive lines within the mesh 114 may be approximately 10 micrometers (um) wide. In comparison, the signal traces within the conductive layers 106, 108 and/or 112 may be approximately 2 um to approximately 3 um wide. Each opening in the mesh 114 may range from approximately 8.5 um to approximately 9 um. In some embodiments, the openings may occupy 45 percent to 55 percent of the area of the mesh 114. Other sizes of the mesh 114 may be implemented to meet a design criteria of a particular application.

Figure 4:
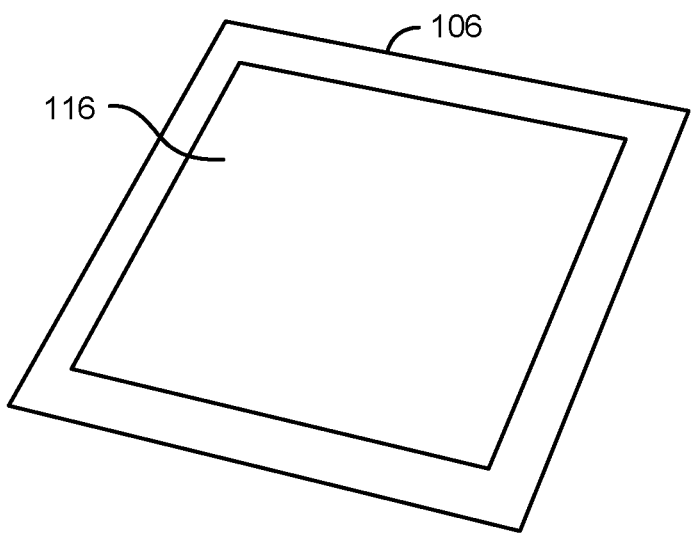
FIG. 4 is a layout diagram of a lower intermediate layer of the transition circuit in accordance with an embodiment of the invention.

Referring to FIG. 4, a layout diagram of an example implementation of the lower intermediate conductive layer 106 is shown in accordance with an embodiment of the invention. The lower intermediate conductive layer 106 may contain an opening 116 aligned with the area where the change of direction exists. The opening 116 in the grounded lower intermediate conductive layer 106 generally allows the transmission line characteristics of the traces in the change of direction to remain consistent.

Figure 5:
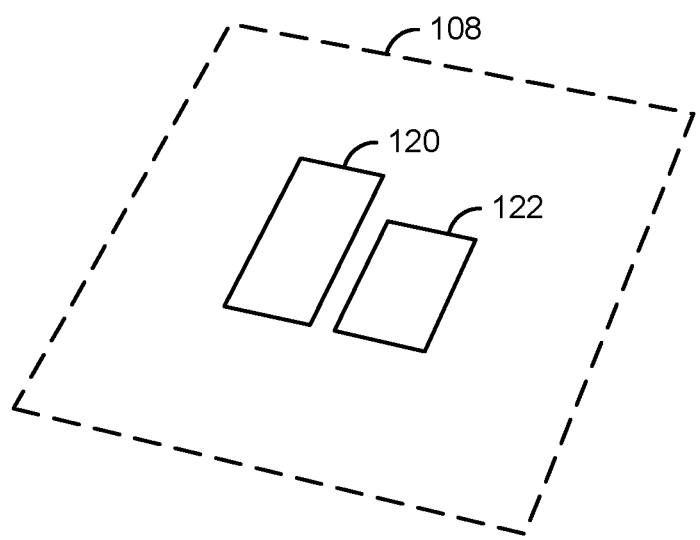
FIG. 5 is a layout diagram of an upper intermediate conductive layer of the transition circuit in accordance with an embodiment of the invention.

Referring to FIG. 5, a layout diagram of an example implementation of the upper intermediate conductive layer 108 is shown in accordance with an embodiment of the invention. The upper intermediate conductive layer 108 generally comprises a trace segment having multiple (e.g., two) parallel trace segments 120 and 122. The trace segments 120 and 122 may be operational to carry the individual signal components of the differential signal through a portion of the change of direction. The trace segments 120 and 122 may be aligned with the opening 116 in the lower intermediate conductive layer 106. The trace segments 120 and 122 may also be aligned with the mesh 114 in the bottom conductive layer 104.

Figure 6:
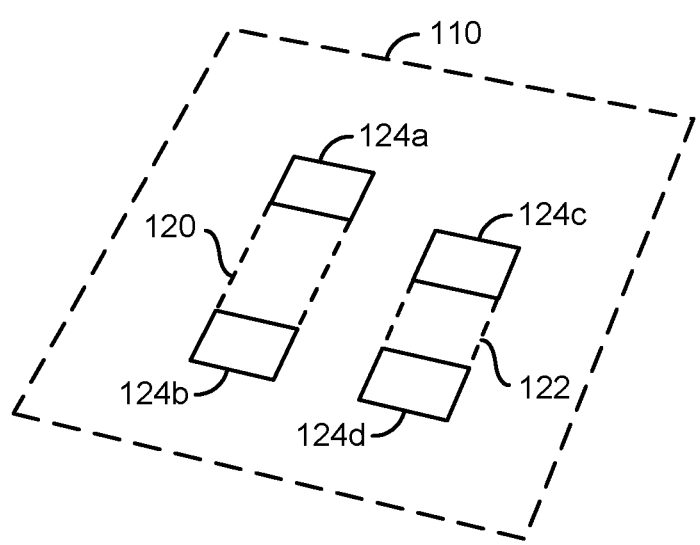
FIG. 6 is a layout diagram of a via layer of the transition circuit in accordance with an embodiment of the invention.

Referring to FIG. 6, a layout diagram of an example implementation of the via layer 110 is shown in accordance with an embodiment of the invention. The via layer 110 may be formed with an insulating material and patterned to create multiple vias (or openings) 124a to 124d. Each via 124a to 124d may be sufficiently sized to allow the material that forms the top conductive layer 112 to reach through and establish electrical contact with the upper intermediate conductive layer 108. In the example, the vias 124a and 124b may be aligned with opposite ends of the trace segment 120 in the upper intermediate conductive layer 108. The vias 124c and 124d may be aligned with opposite ends of the trace segment 122 in the upper intermediate conductive layer 108.

Figure 7:
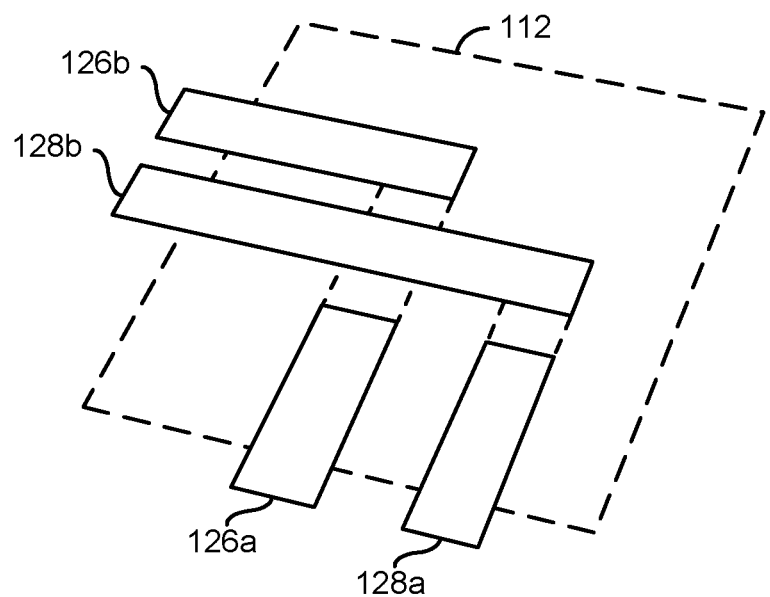
FIG. 7 is a layout diagram of a top conductive layer of the transition circuit in accordance with an embodiment of the invention.

Referring to FIG. 7, a layout diagram of an example implementation of the top conductive layer 112 is shown in accordance with an embodiment of the invention. The top conductive layer 112 generally comprises multiple parallel trace segments, one trace segment having two components 126a to 126b and another trace segment having two components 128a to 128b. The trace segments 126a and 128a may be operational to bring the differential signal into the change of direction. The trace segments 126b and 128b may carry the differential signal out of the change of direction.

The trace segments 126a and 126b are generally aligned with the vias 124b and 124a, respectively. A signal arriving on the trace segment 126a may be transferred through the via 124b to the trace segment 120 in the upper intermediate conductive layer 108. The signal may subsequently be transferred through the via 124a to the trace segment 126b in the top conductive layer 112.

The trace segments 128a and 128b are generally aligned with the vias 124d and 124c, respectively. A signal arriving on the trace segment 128a may be transferred through the via 124d to the trace segment 122 in the upper intermediate conductive layer 108. The signal may subsequently be transferred through the via 124c to the trace segment 128b in the top conductive layer 112.

A length from a start of the trace segment 126a, through the trace segment 120, to an end of the trace segment 126b may be approximately the same as a corresponding length from a start of the trace segment 128a, through the trace segment 122, to an end of the trace segment 128b. As such, the times for each signal component of a differential signal to traverse the transition circuit 100 are approximately the same. Since both traversal times are similar, the transition circuit 100 may introduce a minimal phase imbalance between the two signal components of the differential signal exiting on the trace segments 126b and 128b. Since both lengths are similar through the transition circuit 100, an impedance seen by each signal component may also be similar. Therefore, the transition circuit 100 may introduce a minimal amplitude imbalance between the two signal components of the differential signal exiting on the trace segments 126b and 128b.

In some embodiments, the traces may be used to carry multiple single-ended signals. For example, where the transition circuits 100 are used with a memory circuit, one trace may carry a data signal while the other trace may carry a data strobe signal synchronized with the data signal.

In various embodiments, the transition circuits 100 may include more than two traces. For example, additional trace segments may be added between the trace segments 126a and 128a and between the trace segments 126b and 128b in the top conductive layer 112 (see FIG. 7). Another trace segment may be included between the trace segments 120 and 122 in the upper intermediate conductive layer 108 (see FIG. 5). The added trace may enter the corner between the trace segments 126a and 128a, pass between the trace segments 120 and 122 and under the trace segment 128b, continue between the trace segments 126a and 128b, and subsequently pass over the trace segment 120 and away from the corner.

Figure 8:
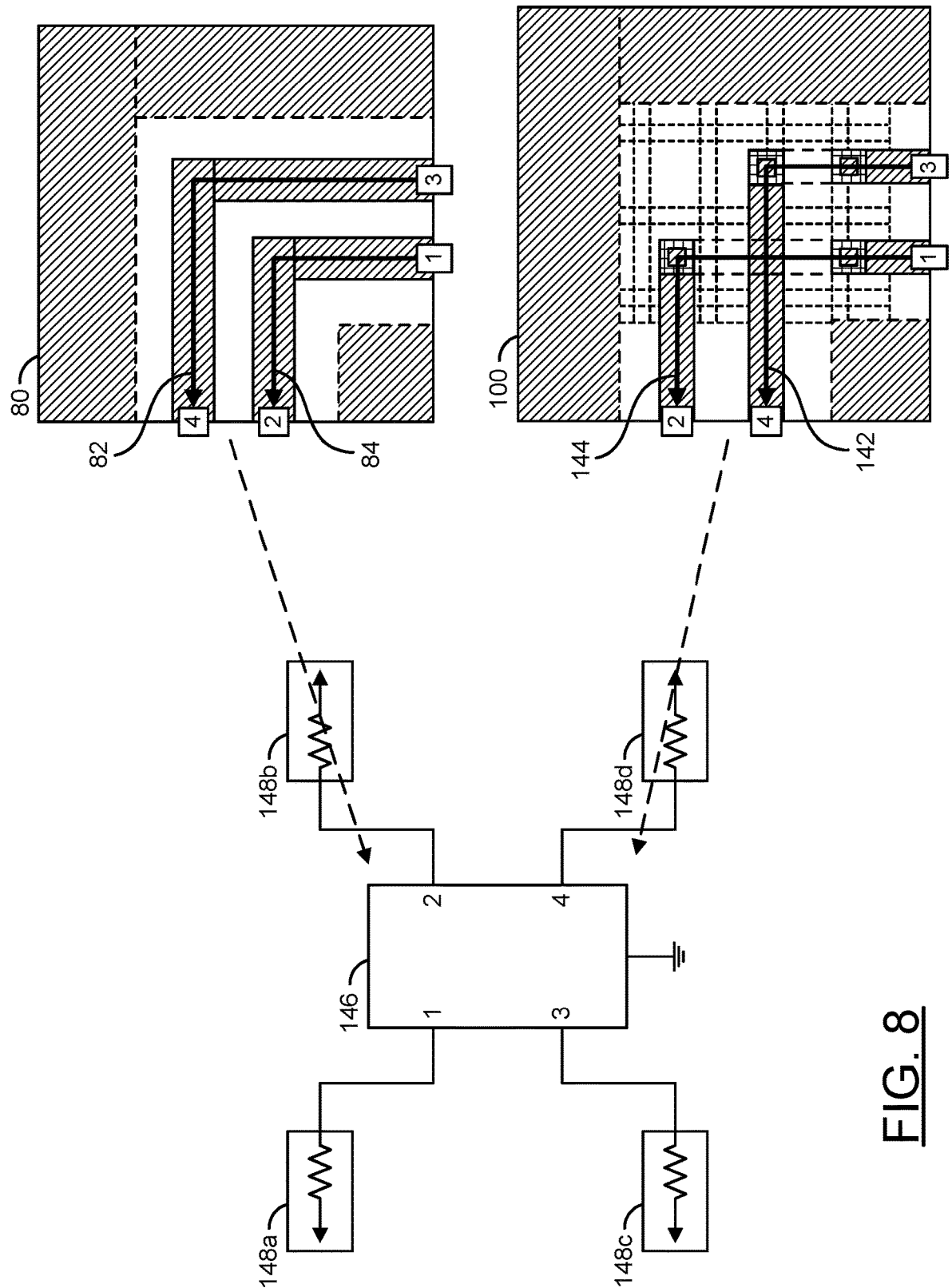
FIG. 8 is a diagram of a test system for measuring scattering parameters.

Referring to FIG. 8, a diagram of an example test system for measuring scattering parameters (s-parameters) is shown. The test system generally comprises a probe (or interface) 146 and multiple loads (or resistors) 148a to 148d. Each load 148a to 148d may be connected between a signal ground and a corresponding node (e.g., nodes 1 to 4) of the probe 146. Each load 148a to 148d may have a fixed impedance (e.g., 50 ohms). A transition circuit 100 or 80 may be connected to the probe 146 while the measurements are performed.

The test system may be operational to measure the s-parameters over a frequency range of 10 GHz to 100 GHz, with a step size of 1.0 GHz. The s-parameters generally describe a response of an N-port network to signals incident at any or all ports. The first character (A) of the s-parameter may refer to the responding port. The second character (B) may refer to the incident port. Thus "S(A,B)" generally means the response at port A due to a signal at port B. The s-parameters may be measured with a vector network analyzer.

The transition circuit 100 is shown marked with nodes 1 to 4 that correspond to the same numbered nodes of the probe 146. A differential signal sent into the transition circuit 100 at the nodes 1 and 3 generally comprises two signal components 142 and 144. The signal component 142 may travel from the node 3 to the node 4. The signal component 144 may travel from the node 1 to the node 2.

A common transition circuit 80 is shown with nodes 1 to 4 marked accordingly. The common transition circuit 80 generally has all traces on a single conductive layer and a single ground layer beneath. A differential signal sent into the common transition circuit 80 at the nodes 1 and 3 generally comprises two signal components 82 and 84. The signal component 82 may travel from the node 3 to the node 4. The signal component 84 may travel from the node 1 to the node 2. Note that a length between the node 1 and the node 2 of the common transition circuit 80 is shorter than a length between the node 3 and the node 4. The different lengths generally give rise to phase imbalances between the signal components 82 and 84. The different lengths also result in different impedances seen by the signal components 82 and 84. Therefore, the common transition circuit 80 creates amplitude imbalances between the signal components 82 and 84 exiting the common transition circuit 80.

Figure 9:
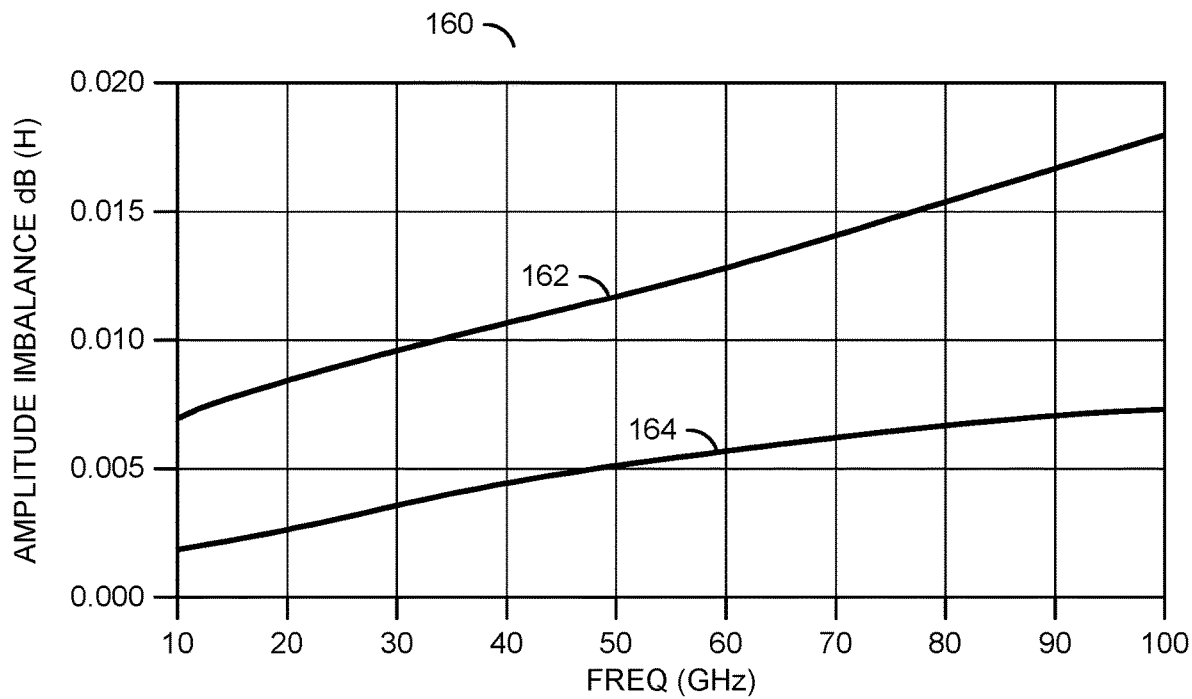
FIG. 9 is a diagram of amplitude imbalance measurements.

Referring to FIG. 9, a diagram 160 of example amplitude imbalance measurements over a range of frequencies is shown. The measurements are generally shown over the frequency range of 10 GHz to 100 GHz. The amplitude imbalances are shown in decibels (dB). The amplitude imbalances may be calculated per formula 1 as follows:

$$\text{Amplitude Imbalance} = \text{mag}(\text{db}(S(2,1)) - \text{db}(S(4,3))) \quad (1)$$

Where "mag( )" is a common magnitude function, S(2,1) is an amplitude at node 2 due to an amplitude at node 1, and S(4,3) is an amplitude at node 4 due to an amplitude at node 3.

The diagram 160 may illustrate a curve 162 for the amplitude imbalance of the common transition circuit 80 as measured by the test system of FIG. 8. A curve 164 may illustrate the amplitude imbalance of the transition circuit 100 as measured by the test system of FIG. 8. The diagram 160 generally shows that the transition circuit 100 consistently induces a lower amplitude imbalance than the common transition circuit 80 (e.g., at least 0.005 dB lower amplitude imbalance at 10 GHz).

Figure 10:
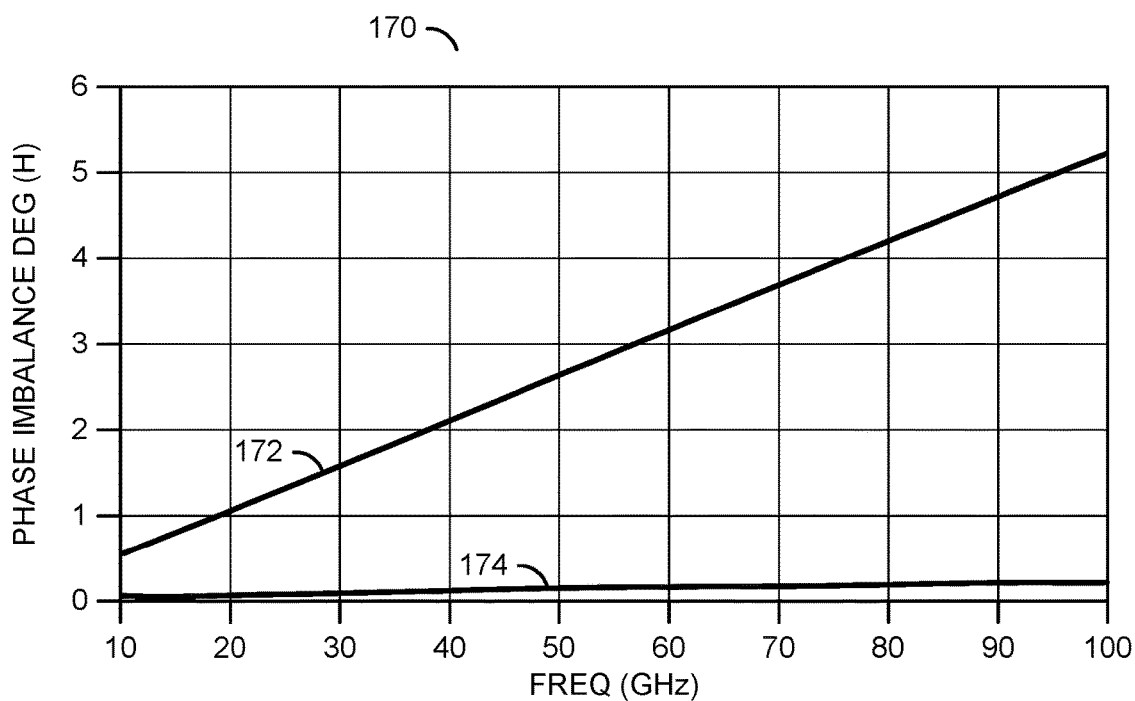
FIG. 10 is a diagram of phase imbalance measurements.

Referring to FIG. 10, a diagram 170 of example phase imbalance measurements is shown. The measurements are generally shown over the frequency range of 10 GHz to 100 GHz. The phase imbalances are shown in degrees. The phase imbalances may be calculated per formula 2 as follows:

$$\text{Phase Imbalance} = \text{mag}(\text{phase}(S(2,1)) - \text{phase}(S(4,3))) \quad (2)$$

Where "mag( )" is a common magnitude function, S(2,1) is a phase at node 2 due to a phase at node 1, and S(4,3) is a phase at node 4 due to a phase at node 3.

The diagram 170 may illustrate a curve 172 for the phase imbalance of the common transition circuit 80 as measured by the test system of FIG. 8. A curve 174 may illustrate the phase imbalance of the transition circuit 100 as measured by the test system of FIG. 8. The diagram 170 generally shows that the common transition circuit 80 has an increasing phase imbalance as the frequency increases. The phase imbalance caused by the transition circuit 100 may be relatively unchanged over the entire frequency range.

Figure 11:
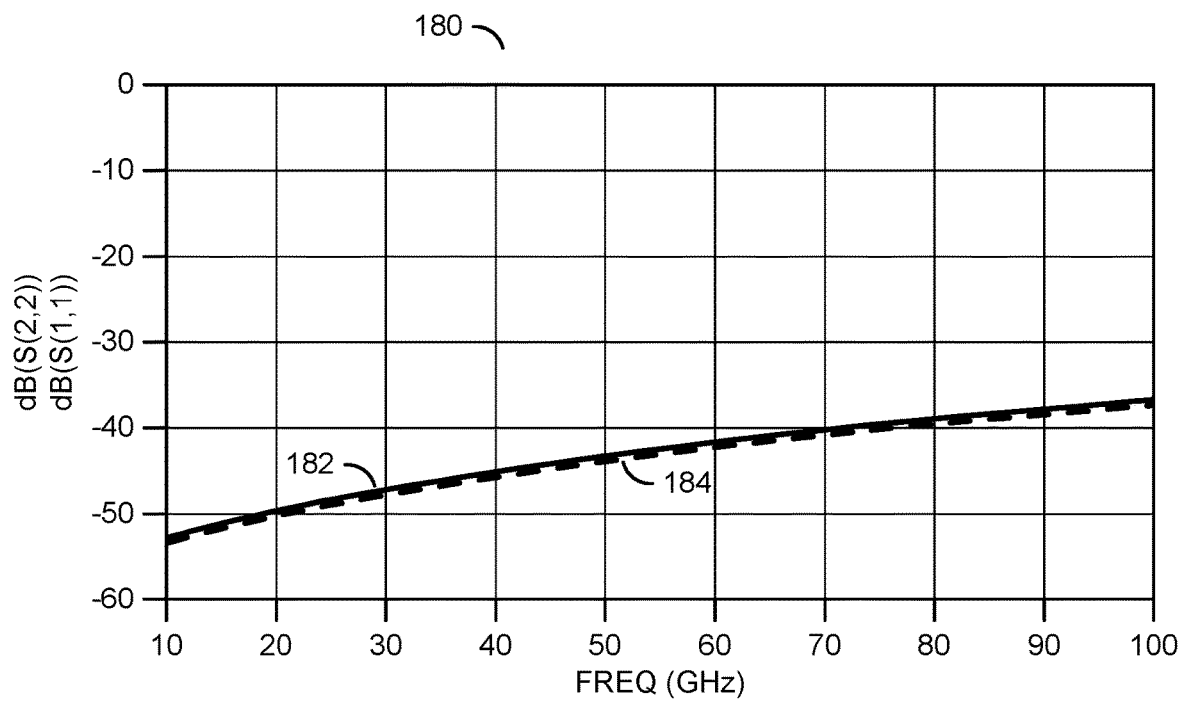
FIG. 11 is a diagram of return loss measurements.

Referring to FIG. 11, a diagram 180 of example return loss measurements is shown. The measurements are generally shown over the frequency range of 10 GHz to 100 GHz. The return losses are shown in decibels. A curve 182 generally illustrates a return loss performance as see at port 1 (e.g., S(1,1)) of the transition circuit 100. A curve 184 generally illustrates a return loss performance as see at port 2 (e.g., S(2,2)) of the transition circuit 100.

Figure 12:
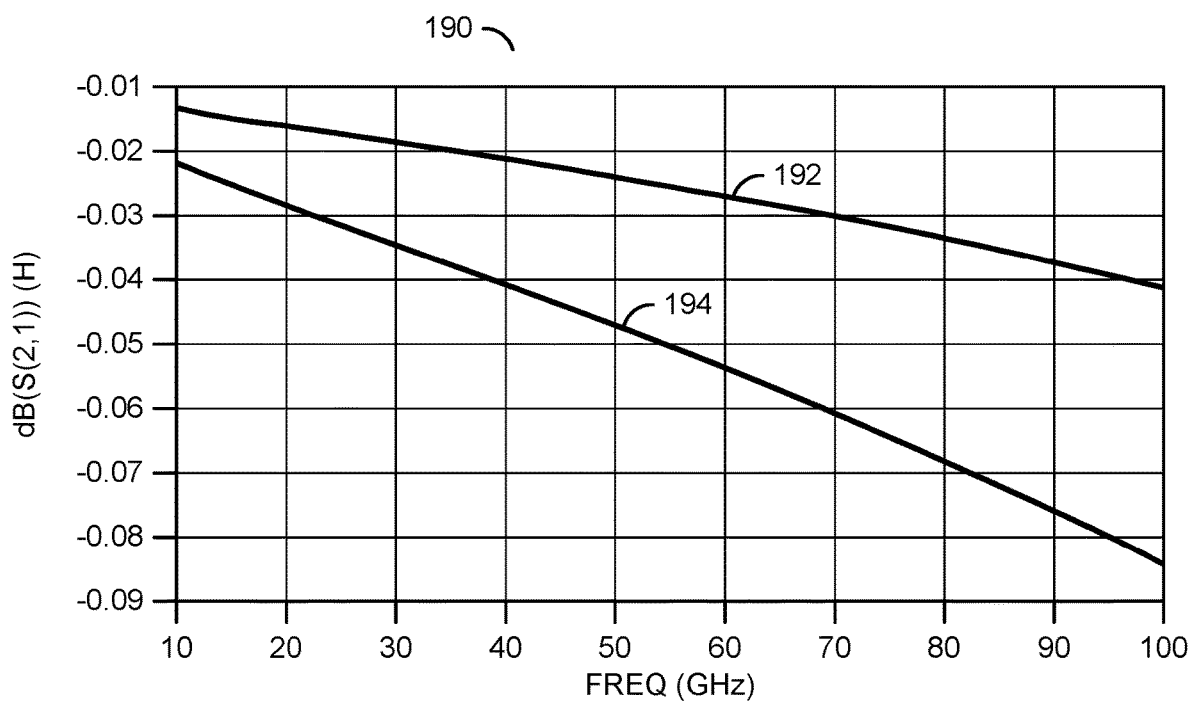
FIG. 12 is a diagram of insertion loss measurements.

Referring to FIG. 12, a diagram 190 of example insertion loss measurements is shown. The measurements are generally shown over the frequency range of 10 GHz to 100 GHz. The insertion losses are shown in decibels. A curve 192 generally illustrates the insertion loss performance (e.g., S(2,1)) of the common transition circuit 80. A curve 194 may illustrate the insertion loss performance (e.g., S(2,1)) of the transition circuit 100.

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a plurality of conductive layers;
a plurality of traces having a predefined width and configured to carry a plurality of signals through a change of direction, wherein (i) said traces are routed parallel to each other in a first direction with a first order in a first trace segment in a first of said conductive layers, (ii) said traces are routed parallel to each other in a direction with a second order in a second trace segment in a second of said conductive layers, (iii) said traces are routed parallel to each other in said second direction with said second order in a third trace segment in said first conductive layer, (iv) a first end of said traces in said first trace segment are connected by vias through a first insulating layer to a first end of said traces in said second trace segment, (v) a second end of said traces in said second trace segment are connected by vias through said first insulating layer to a first end of said traces in said third trace segment, and (vi) a path of at least one of said traces in said second trace segment crosses a path of at least one of said traces in said first trace segment; and a third of said conductive layers separated from said second conductive layer by a second insulating layer, wherein said third conductive layer is configured as a ground plane for said first trace segment and said third trace segment, and includes a non-conductive opening aligned with said second trace segment.

2. The apparatus according to claim 1, wherein (i) said change of direction is approximately 90 degrees and (ii) two of said signals comprise a differential signal.

3. The apparatus according to claim 1, wherein at least two of said signals have a frequency in a range of 24 gigahertz to 44 gigahertz.

4. The apparatus according to claim 1, wherein said apparatus is configured as part of a fifth generation (5G) wireless communications system.

5. The apparatus according to claim 1, further comprising a fourth of said conductive layers (i) electrically isolated from said first conductive layer, said second conductive layer, and said third conductive layer by at least a third insulating layer, and (ii) comprising an area aligned with said second trace segment and electrically grounded to form a ground plane for said traces in said second trace segment.

6. The apparatus according to claim 5, wherein said electrically grounded area in said fourth conductive layer comprises a mesh pattern in said area aligned with said second trace segment.

7. The apparatus according to claim 5, further comprising one or more additional conductive layers between said third conductive layer and said fourth conductive layer.

8. The apparatus according to claim 1, wherein corresponding lengths of said traces through said change of direction from a start of said first trace segment to and end of said third trace segment approximately match each other.

9. The apparatus according to claim 8, wherein matching said corresponding lengths of said traces through said change of direction reduces an amplitude imbalance between each individual one of said signals.

10. The apparatus according to claim 8, wherein matching said corresponding lengths of said traces through said change of direction reduces a phase imbalance between each individual one of said signals.

11. A method for carrying a plurality of signals in a plurality of traces through a change of direction, comprising the steps of:

routing said traces parallel to each other in a first direction with a first arrangement in a first trace segment in a first conductive layer;

routing said traces parallel to each other in a second direction with a second arrangement in a second trace segment in a second conductive layer, wherein a path of at least one of said traces in said second trace segment crosses a path of at least one of said traces in said first trace segment;

routing said traces parallel to each other in said second direction with said second arrangement in a third trace segment in said first conductive layer;

connecting a first end of said traces in said first trace segment by vias through a first insulating layer to a first end of said traces in said second trace segment;

connecting a second end of said traces in said second trace segment by vias through said first insulating layer to a first end of said traces in said third trace segment; and forming a non-conductive opening in a third conductive layer, wherein said third conductive layer is (i) separated from said second conductive layer by a second insulating layer, (ii) configured as a ground plane for said first trace segment and said third trace segment, and (iii) includes a non-conductive opening aligned with said second trace segment.

12. The method according to claim 11, wherein (i) said change of direction is approximately 90 degrees and (ii) two of said signals comprise a differential signal.

13. The method according to claim 11, wherein at least two of said signals have a frequency in a range of 24 gigahertz to 44 gigahertz.

14. The method according to claim 11, wherein the steps are implemented in a fifth generation (5G) wireless communications system.

15. The method according to claim 11, wherein the conductive layers are a portion of at least one of a printed circuit board and an integrated circuit.

16. The method according to claim 11, further comprising the step of:

providing a ground plane for said traces in said second trace segment in a fourth conductive layer that is (i) electrically isolated from said first conductive layer, said second conductive layer, and said third conductive layer and (ii) comprises an area aligned with said second trace segment and electrically grounded.

17. The method according to claim 16, wherein said electrically grounded area in said fourth conductive layer comprises a mesh pattern in said area aligned with said second trace segment.

18. The method according to claim 11, wherein corresponding lengths of said traces through said change of direction from a start of said first trace segment to and end of said third trace segment approximately match each other.

19. The method according to claim 18, wherein matching said corresponding lengths of said traces through said change of direction reduces an amplitude imbalance between each individual one of said signals.

20. The method according to claim 18, wherein matching said corresponding lengths of said traces through said change of direction reduces a phase imbalance between each individual one of said signals.

* * * * *